United States Patent
Ahn et al.

[11] Patent Number: 5,905,274
[45] Date of Patent: May 18, 1999

[54] THIN-FILM TRANSISTOR AND METHOD OF MAKING SAME

[75] Inventors: Byung-Chul Ahn, Kumi-shi; Hyun-Sik Seo, Anyang-shi, both of Rep. of Korea

[73] Assignee: L.G. Electronics, Inc., Youngdungpo-ku, Japan

[21] Appl. No.: 08/918,119

[22] Filed: Aug. 27, 1997

[30] Foreign Application Priority Data

Mar. 4, 1997 [KR] Rep. of Korea .......................... 97-7010

[51] Int. Cl.$^6$ .......................... H01L 29/04; H01L 31/036; H01L 31/0376
[52] U.S. Cl. .................. 257/59; 257/61; 257/72; 257/350
[58] Field of Search .................. 257/57, 58, 59, 257/60, 61, 66, 72, 350

[56] References Cited

U.S. PATENT DOCUMENTS

| | | | |
|---|---|---|---|
| 5,036,370 | 7/1991 | Miyago et al. | |
| 5,132,745 | 7/1992 | Kwasnick et al. | |
| 5,156,986 | 10/1992 | Wei et al. | 437/40 |
| 5,428,250 | 6/1995 | Ikeda et al. | 257/761 |

FOREIGN PATENT DOCUMENTS

| | | |
|---|---|---|
| 0602315 | 7/1993 | European Pat. Off. |
| 03114028 | 5/1991 | Japan. |
| 6-37311 | 2/1994 | Japan. |
| 2254187 | 9/1992 | United Kingdom. |

OTHER PUBLICATIONS

"Low Cost, High Display Quality TFT–LCD Process", Society for Information Display, EuroDisplay 96, Proceedings of the 16th International Display Research Conference, Oct. 1, 1996, 591–594.

"Hilllock–Free Al–Gate Materials Using Stress–Absorbing Buffer Layer for Large Area AMLCDs" Society for Information Display 96 Digest, pp. 341–344, 1996.

*Primary Examiner*—Ngân V. Ngô
*Attorney, Agent, or Firm*—Graham & James LLP

[57] ABSTRACT

A thin-film transistor includes a substrate and a gate including a double-layered structure having first and second metal layers provided on the substrate, the first metal layer being wider than the second metal layer by about 1 to 4 $\mu$m. A method of making such a thin film transistor includes the steps of: depositing a first metal layer on a substrate, depositing a second metal layer directly on the first metal layer; forming a photoresist having a designated width on the second metal layer; patterning the second metal layer via isotropic etching using the photoresist as a mask; patterning the first metal layer by means of an anisotropic etching using the photoresist as a mask, the first metal layer being etched to have the designated width, thus forming a gate having a laminated structure of the first and second metal layers; and removing the photoresist.

6 Claims, 6 Drawing Sheets

THIN-FILM TRANSISTOR AND METHOD OF MAKING SAME

BACKGROUND OF THE INVENTION

1. Field of the Invention

The present invention relates to a thin-film transistor of a liquid crystal display and, more particularly, to a thin-film transistor having a gate including a double-layered metal structure and a method of making such a double-layered metal gate.

2. Discussion of Related Art

An LCD (Liquid Crystal Display) includes a switching device as a driving element, and a pixel-arranged matrix structure having transparent or light-reflecting pixel electrodes as its basic units. The switching device is a thin-film transistor having gate, source and drain regions.

The gate of the thin-film transistor is made of aluminum to reduce its wiring resistance, but an aluminum gate may cause defects such as hillock.

A double-layered metal gate, i.e., molybdenum-coated aluminum gate is considered as a substitute for the aluminum gate to overcome the problem of the hillock.

To fabricate a double-layered gate, metals such as aluminum and molybdenum are sequentially deposited, followed by a patterning process carried out via photolithography to form resulting metal films which have the same width. Although the double-layered gate is desirable to overcome the problem of hillock, the resulting deposited metal films forming the double-layered gate are so thick that a severe single step is created by a thickness difference between the metal films and a substrate, thereby causing a single step difference between the substrate and the double-layered gate which deteriorates the step coverage of a later formed gate oxide layer. The source and drain regions formed on the gate oxide layer may have disconnections between areas of the source and drain regions which are overlapped and non-overlapped with the gate, or electrically exhibit short circuits as a result of contact with the gate.

According to another method of forming the gate, each of the metal layers of Al and Mo form a double step difference with the substrate so as to improve the step coverage of the gate oxide layer.

FIGS. 1A through 1F are diagrams illustrating the process for fabricating a thin-film transistor of a method which is related to the invention described and claimed in the present application. The method shown in FIGS. 1A–1F is not believed to be published prior art but is merely a recently discovered method related to the invention described and claimed in the present application.

Referring to FIG. 1A, aluminum is deposited on a substrate 11 to form a first metal layer 13. A first photoresist 15 is deposited on the first metal layer 13. The first photoresist 15 is exposed and developed so as to have a certain width w1 extending along the first metal layer 13.

Referring to FIG. 1B, the first metal layer 13 is patterned via wet etching using the first photoresist 15 as a mask so that the first metal layer 13 has a certain width w1. After the first photoresist 15 is removed, a second metal layer 17 is formed by depositing Mo, Ta, or Co on the substrate 11 so as to cover the first metal layer 13. A second photoresist 19 is then deposited on the second metal layer 17. The second photoresist 19 is exposed and developed so as to have a certain width w2 extending along the second metal layer 17 and located above the first metal layer 13.

Referring to FIG. 1C, the second metal layer 17 is patterned via a wet etching process using the second photoresist 19 as a mask such that the second metal layer 17 has a certain width w2 which is narrower than the width w1 of the first metal layer 13. After formation of the gate 21, the second photoresist 19 is removed.

Thus, the patterned first and second metal layers 13 and 17 form a gate 21 having a double-layered metal structure that provides a double step difference between the double-layered metal gate structure 21 and the substrate 11. The formation of the gate 21 as described above and shown in FIGS. 1–3 requires the use of two photoresists 15, 19 and two photoresist steps.

In the gate 21 shown in FIG. 3, the second metal layer 17 is preferably centrally located on the first metal layer 13. Although there is no specific information available regarding a relationship of w1 to w2 of this related method, based on their understanding of this related method resulting in the structure shown in FIG. 3, the inventors of the invention described and claimed in the present application assume that the width difference w1–w2 between the first and second metal layers 13 and 17 is larger than or equal to 4 $\mu$m, that is, w1–w2$\geq$4 $\mu$m.

Referring to FIG. 1D, a first insulating layer 23 is formed by depositing silicon oxide $SiO_2$ or silicon nitride $Si_3N_4$ as a single-layered or double-layered structure on the gate 21 and substrate 11. Semiconductor and ohmic contact layers 25 and 27 are formed by sequentially depositing undoped polycrystalline silicon and heavily doped silicon on the first insulating layer 23. The semiconductor and ohmic contact layers 25 and 27 are patterned to expose the first insulating layer 23 by photolithography.

Referring to FIG. 1E, conductive metal such as aluminum is laminated on the insulating and ohmic contact layers 23 and 27. The conductive metal is patterned by photolithography so as to form a source electrode 29 and a drain electrode 31. A portion of the ohmic contact layer 27 exposed between the source and drain electrodes 29 and 31 is etched by using the source and drain electrodes 29 and 31 as masks.

Referring to FIG. 1F, silicon oxide or silicon nitride is deposited on the entire surface of the structure to form a second insulating layer 33. The second insulating layer 33 is etched to expose a designated portion of the drain electrode 31, thus forming a contact hole 35. By depositing transparent and conductive material on the second insulating layer 33 and patterning it via photolithography, a pixel electrode 37 is formed so as to be electrically connected to the drain electrode 31 through the contact hole 35.

According to the method of fabricating a thin-film transistor as described above and shown in FIGS. 1A–1F, respective first and second metal layers are formed through photolithography using different masks so as to form the gate with a double-layered metal structure, resulting in double step differences between the gate and substrate.

As a result of the double step difference between the gate 21 and the substrate 11 shown in FIG. 1C, a hillock often occurs on both side portions of the first metal layer 13 which have no portion of the second metal layer 17 deposited thereon when the first metal layer 13 is wider than the second metal layer 17 as in FIG. 1C. Another problem with this related method is that the process for forming a gate is complex and requires two photoresists 15, 19 and two steps of deposition and photolithography. As a result, the contact resistance between the first and second metal layers may be increased.

Another method of forming a double metal layer gate structure is described in "Low Cost, High Quality TFT-LCD Process", SOCIETY FOR INFORMATION DISPLAY EURO DISPLAY 96, Proceedings of the 16th International Display Research Conference, Birmingham, England, Oct. 1, 1996, pages 591–594. On page 592 of this publication, a method of forming a double metal gate structure includes the process of depositing two metal layers first and then patterning the two metal layers to thereby eliminate an additional photoresist step. However, with this method, process difficulties during the one step photoresist process for forming the double metal layer gate resulted in the top layer being wider than the bottom layer causing an overhang condition in which the top layer overhangs the bottom layer. This difficulty may result in poor step coverage and disconnection. This problem was solved by using a three-step etching process in which the photoresist had to be baked before each of the three etching steps to avoid lift-off or removal of the photoresist during etching. This three-step etching process and required baking of the photoresist significantly increases the complexity and steps of the gate forming method.

SUMMARY OF THE INVENTION

To overcome the problems discussed above, the preferred embodiments of the present invention provide a thin-film transistor which prevents a hillock and deterioration of step coverage of a later formed gate oxide layer on a double metal layer gate.

The preferred embodiments of the present invention also provide a method of fabricating a thin-film transistor that simplifies the process for forming a double metal layer gate.

The preferred embodiments of the present invention further provide a method of fabricating a thin-film transistor that reduces the contact resistance between the first and second metal layers constituting a gate.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof, as well as, the appended drawings.

To achieve these and other advantages and in accordance with the purpose of the preferred embodiments of the present invention, as embodied and broadly described, a thin-film transistor preferably comprises a substrate, and a gate including a double-layered structure of first and second metal layers disposed on the substrate, the first metal layer being wider than the second metal layer by about 1 to 4 $\mu$m, and a method of making such a thin-film transistor preferably comprises the steps of: depositing a first metal layer on a substrate, depositing a second metal layer directly on the first metal layer; forming a photoresist having a desired width on the second metal layer; patterning the second metal layer via an isotropic etching using the photoresist as a mask; patterning the first metal layer via an anisotropic etching using the photoresist as a mask, the first metal layer being etched to have a desired width, thus forming a gate having a laminated structure of the first and second metal layers; and removing the photoresist.

These and other elements, features, and advantages of the preferred embodiments of the present invention will be apparent from the following detailed description of the preferred embodiments of the present invention, as illustrated in the accompanying drawings.

BRIEF DESCRIPTION OF THE DRAWINGS

The accompanying drawings, which are included to provide a further understanding of the invention and are incorporated in and constitute a part of this specification, illustrate preferred embodiments of the invention and together with the description serve to explain the principles of the invention, in which.

DETAILED DESCRIPTION OF PREFERRED EMBODIMENTS

Reference will now be made in detail to preferred embodiments of the present invention, examples of which are illustrated in the accompanying drawings.

Figure 1A:
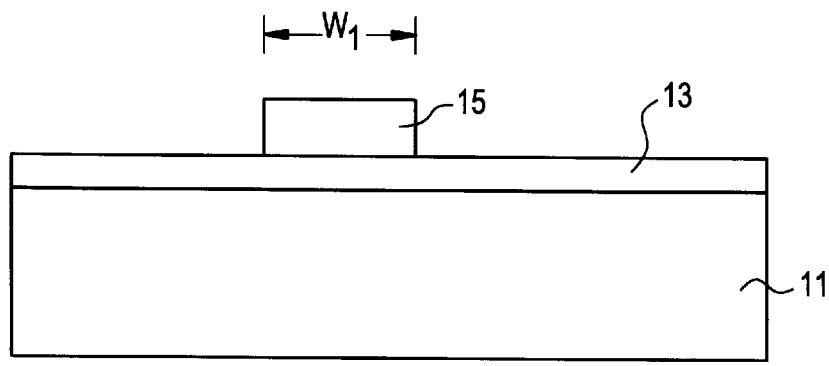
FIGS. 1A through 1F are diagrams illustrating a process for fabricating a thin-film transistor according to a method which is related to the preferred embodiments of the present invention.
Figure 1B:
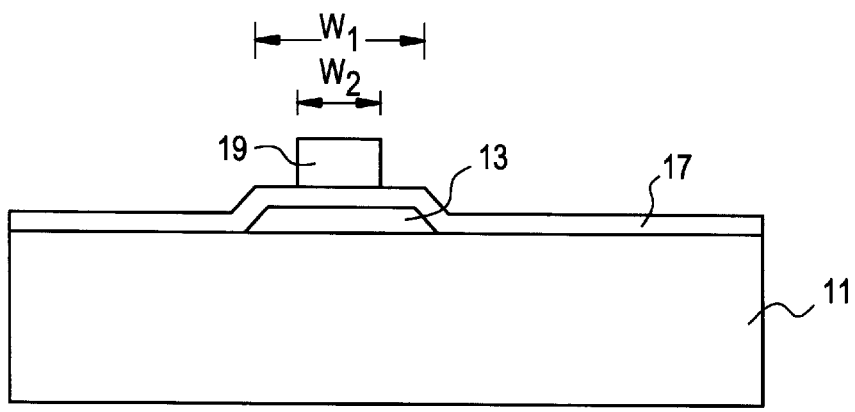
Figure 1C:
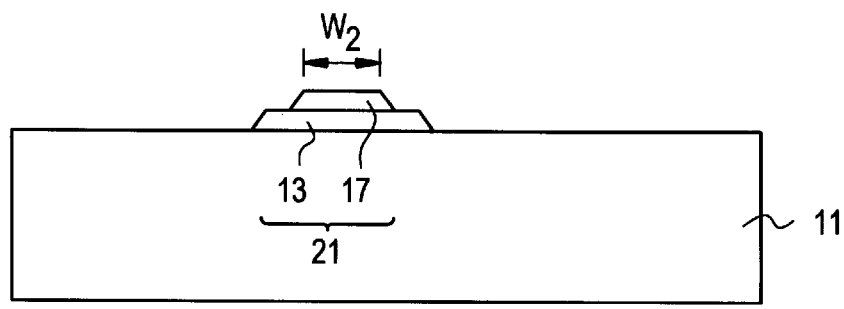
Figure 1D:
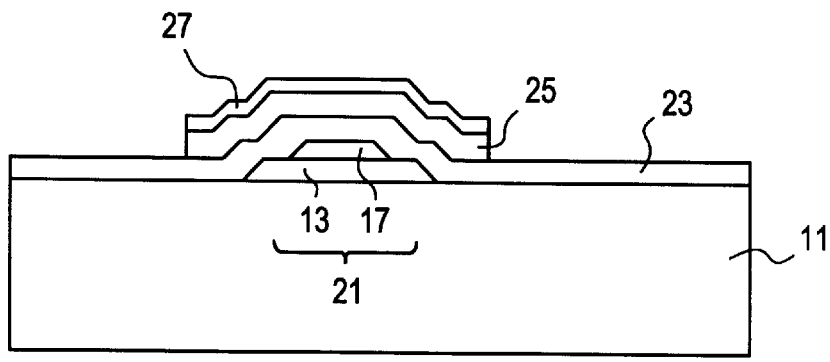
Figure 1E:
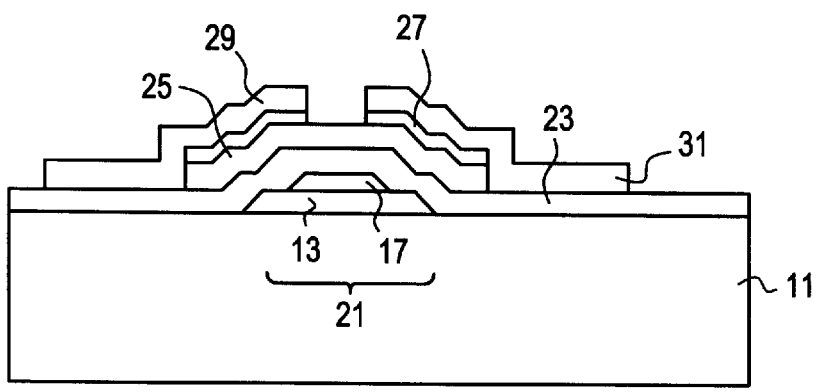
Figure 1F:
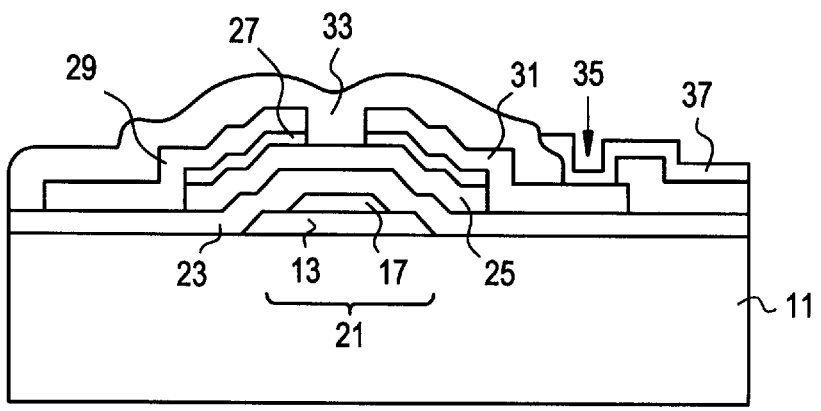
Figure 2:
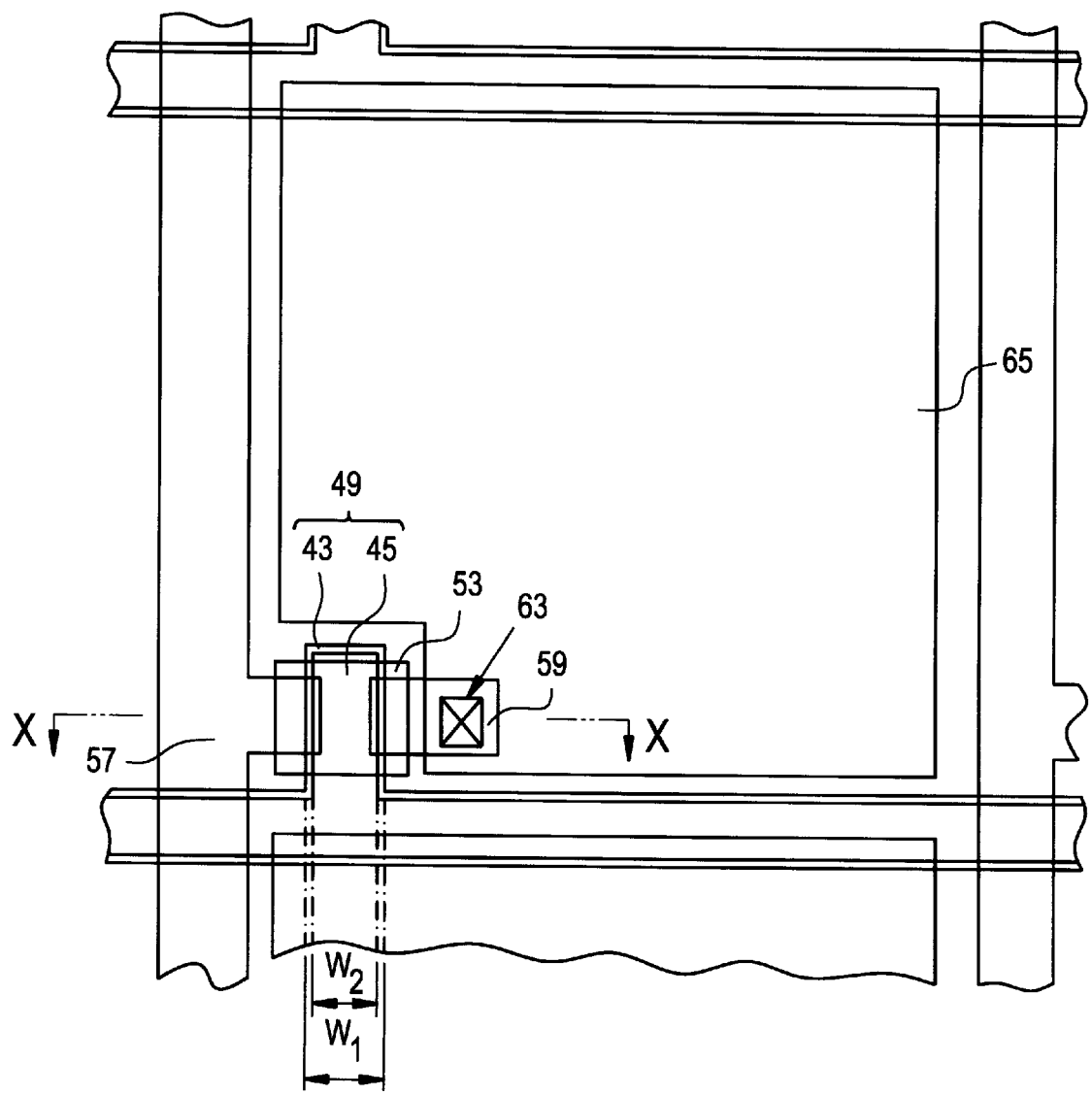
FIG. 2 is a top view of a thin-film transistor according to a preferred embodiment of the present invention.
Figure 3:
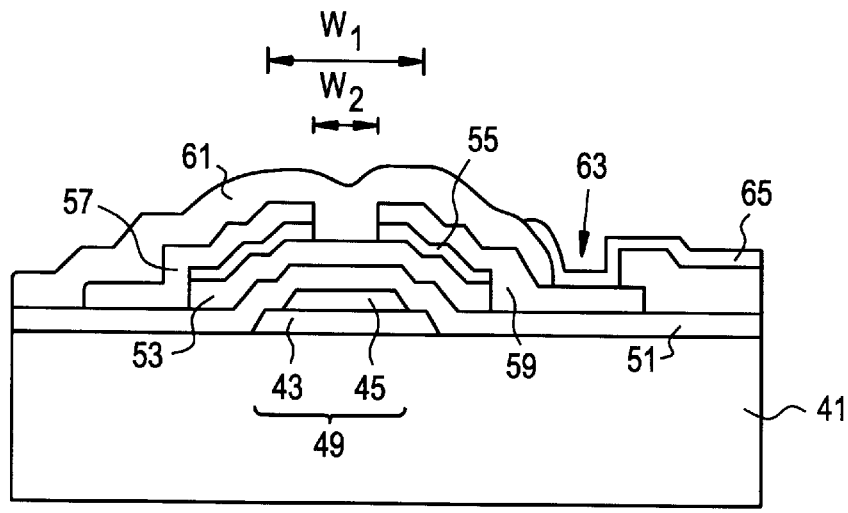
FIG. 3 is a cross-sectional view taken along line X—X of FIG. 2.

FIG. 2 is a top view of a thin-film transistor according to a preferred embodiment of the present invention. FIG. 3 is a cross-sectional view taken along line x—x of FIG. 2.

The thin-film transistor comprises a gate 49 having a double-layered structure of a first metal layer 43, a second metal layer 45 disposed on a substrate 41, a first insulating layer 51, a second insulating layer 61, a semiconductor layer 53, an ohmic contact layer 55, a source electrode 57, a drain electrode 59, and a pixel electrode 65.

The gate 49 has a double-layered structure including the first and second metal layers 43 and 45 disposed on the substrate 41. The first metal layer 43 is preferably formed from a conductive metal such as Al, Cu, or Au deposited to have a certain width w1. The second metal layer 45 is preferably formed from a refractory metal such as Mo, Ta, or Co deposited to have a certain width w2.

The present inventors have discovered that a relationship between the width of the first metal layer and the width of the second metal layer of a double metal layer gate electrode is critical to preventing deterioration of step coverage of a later formed gate oxide layer in such a structure having a double step difference between the substrate and the gate. More specifically, the present inventors determined that a structure wherein the first metal layer 43 is wider than the second metal layer 45 by about 1 to 4 $\mu$m, for example, 1 $\mu$m<w1–w2<4 $\mu$m, provides maximum prevention of deterioration of step coverage of a later formed gate oxide layer in such a structure having a double step difference between the substrate and the gate.

To achieve the best results, the second metal layer 45 is preferably positioned substantially in the middle of the first metal layer 45, so that both side portions of the first metal layer 43 which have no portion of the second metal layer 45 disposed thereon have substantially the same width as each other. The width of each of the side portions is preferably larger than about 0.5 $\mu$m but less than about 2 $\mu$m.

The first insulating layer 51 is preferably formed by depositing single layer of silicon oxide $SiO_2$ or silicon nitride $Si_3N_4$ on the substrate including the gate 49.

The semiconductor and ohmic contact layers 53 and 55 are formed on the portion of the first insulating layer 51 corresponding to the gate 49 by sequentially depositing undoped amorphous silicon and heavily doped amorphous silicon and patterning the two silicon layers. The semiconductor layer 53 is used as the active region of an element, thus forming a channel by means of a voltage applied to the gate 49. The ohmic contact layer 55 provides an ohmic contact between the semiconductor layer 53 and the source and drain electrodes 57 and 59. The ohmic contact layer 55 is not formed in the portion that becomes the channel of the semiconductor layer 53.

The source and drain electrodes 57 and 59 are in contact with the ohmic contact layer 55, and each electrode 57, 59 extends to a designated portion on the first insulating layer 51.

The second insulating layer 61 is formed by depositing insulating material such as silicon oxide $SiO_2$ silicon nitride $Si_3N_4$ to cover the source and drain electrodes 57 and 59 and the first insulating layer 51. The second insulating layer 61 on the drain electrode 59 is removed to form a contact hole 63. The pixel electrode 65 is formed from transparent and conductive material such as ITO (Indium Tin Oxide) or Tin oxide $SnO_2$, so that it is connected to the drain electrode 59 through the contact hole 63.

In the first and second metal layers 43 and 45 constituting the gate 49, each side portion of the first metal layer 43 having no portion of the second metal layer 45 thereon has a width that is preferably larger than about 0.5 $\mu$m and less than about 2 $\mu$m. Because the first metal layer 43 is wider than the second metal layer 45 by about 1.0 $\mu$m to 4.0 $\mu$m, double step differences determined according to the relationship between the width of the first metal layer and the width of the second metal layer are formed between the gate 49 and substrate 41. The double step differences determined according to the novel features of the preferred embodiments of the present invention prevent deterioration of the coverage of the first insulating layer 51 which deterioration occurs in prior art devices. The hillock in the first metal layer 43 is also avoidable because the width difference between the first and second metal layers 43 and 45 is between about 1 $\mu$m to 4 $\mu$m.

FIGS. 4A through 4F are diagrams illustrating the process for fabricating the thin-film transistor of the preferred embodiments of the present invention.

Figure 4A:
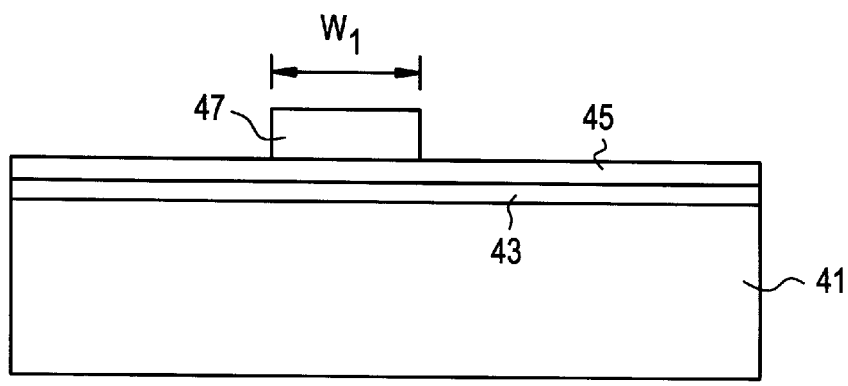
FIGS. 4A through 4F are diagrams illustrating a process for fabricating a thin-film transistor of preferred embodiments of the present invention.

Referring to FIG. 4A, metal such as Al, Cu, or Au is deposited on a substrate so as to form a first metal layer 43. A second metal layer 45 is formed from Mo, Ta, or Co and deposited on the first metal layer 43 without performing a masking step between the step of depositing the first metal layer and the step of depositing the second metal layer. The first and second metal layers 43 and 45 are sequentially deposited so as to preferably have a thickness as large as about 500–4000A and 500–2000A, respectively, by means of sputtering or chemical vapor deposition (hereinafter, referred to as CVD) without breaking a vacuum state. As a result, the contact resistance between the first and second metal layers 43 and 45 is reduced.

According to the preferred embodiments of the present invention, a single photoresist step is used to pattern both the first metal layer 43 and the second metal layer 45 simultaneously. In the single photoresist step, a photoresist 47 is deposited on the second metal layer 45 and then the photoresist 47 is patterned through exposure and development to have the width w1 on a designated portion of the second metal layer 45.

Figure 4B:
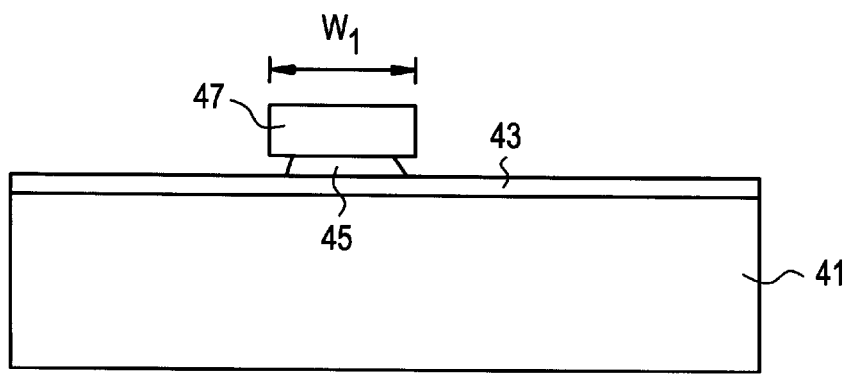

Referring to FIG. 4B, the second metal layer 45 is patterned with an etching solution preferably prepared with a mixture of phosphoric acid $H_3PO_4$, acetic acid $CH_3COOH$ and nitric acid $HNO_3$, by means of a wet etching using the photoresist 47 as a mask. Because the portion of the second metal layer 45 covered with the photoresist 47, as well as, exposed side portions of the second metal layer 45 are isotopically etched, the second metal layer 45 is preferably patterned to have the width w2 which is narrower than the width w1 of the photoresist 47 which is the same as the width w1 of the first metal layer 43, that is, about 1 $\mu$m<w1–w2<4 $\mu$m. Each side portion of the second metal layer 45 preferably has a width larger than about 0.5 $\mu$m and less than about 2 $\mu$m. That is, the two side portions of the second metal layer 45 covered with the photoresist 47 are preferably etched to have substantially the same width as each other. The lateral surfaces of the second metal layer 45 are preferably etched to have a substantially rectangular or inclined shape.

Figure 4C:
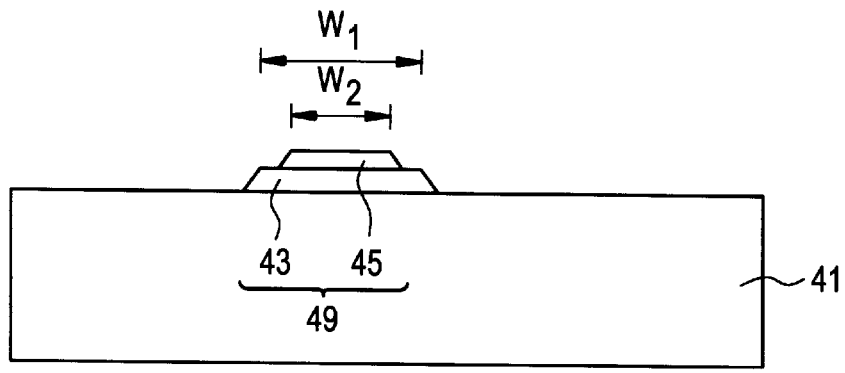

Referring to FIG. 4C, the first metal layer 43 is patterned via a wet etching having anisotropic etching characteristic such as reactive ion etching (hereinafter, referred to as RIE) by using the photoresist 47 as a mask. When etching the first metal layer 43 other than the portion of the layer 43 covered with the photoresist 47, the first metal layer 43 preferably has the same width w1 of the photoresist 47. Thus, patterning of the first and second metal layers 43, 45, respectively, only requires two etching steps and does not require baking of the photoresist before each step of etching. Also, the relation between the first and second metal layers 43 and 45 also may be represented by about 1 $\mu$m<w1–w2<4 $\mu$m.

The first and second metal layers 43 and 45 resulting from the single photoresist step process described above form a gate 49 having a double-layered metal structure. The gate 49 has the second metal layer 45 positioned substantially in the middle of the first metal layer 43 so that the each side portion of the first metal layer 43 having no second metal layer 45 thereon is wider than about 0.5 $\mu$m but narrower than about 2 $\mu$m. The photoresist 47 remaining on the second metal layer 45 is removed after the two etching steps are completed.

Figure 4D:
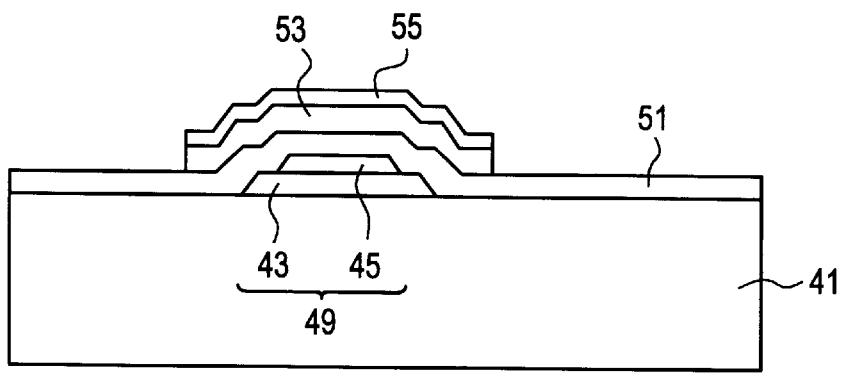

Referring to FIG. 4D, a first insulating layer 51 is formed by depositing a single layer or double layers of silicon oxide $SiO_2$ or silicon nitride $Si_3N_4$ on the gate 49 and substrate 41 by CVD. Because each side portion of the first metal layer 43 having no second metal layer 45 thereon is wider than about 0.5 $\mu$m, double step differences formed between the substrate and gate can prevent the coverage of the first insulating layer 51 from being deteriorated as in prior art devices. The hillock in the first metal layer 43 is also avoidable because a width of a portion of the first metal layer 43 which is exposed is less than about 2 $\mu$m.

Amorphous silicon which is undoped and heavily doped amorphous silicon are sequentially deposited on the first insulating layer 41 by CVD, thus forming semiconductor and ohmic contact layers 53 and 55. The ohmic contact and semiconductor layers 55 and 53 are patterned by means of photolithography to expose the first insulating layer 51.

Figure 4E:
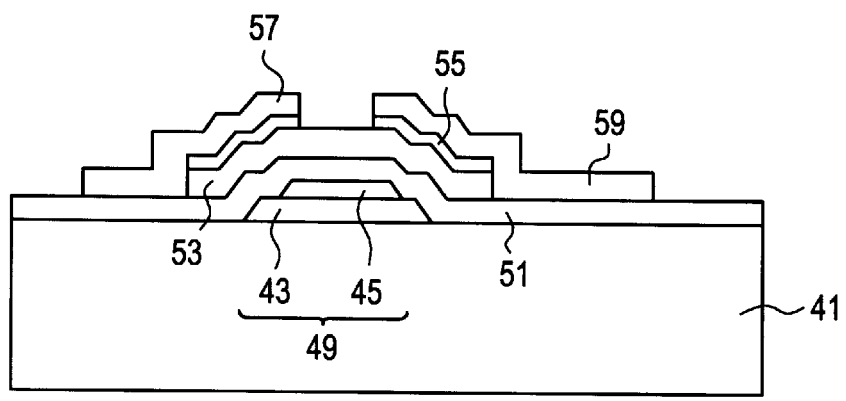

Referring to FIG. 4E, conductive metal such as Al or Cr is laminated on the insulating and ohmic contact layers 51 and 55 and patterned by photolithography to form source and drain electrodes 57 and 59. The ohmic contact layer 55 exposed between the source and drain electrodes 57 and 59 is etched by using the source drain electrodes 57 and 59 as masks.

Figure 4F:
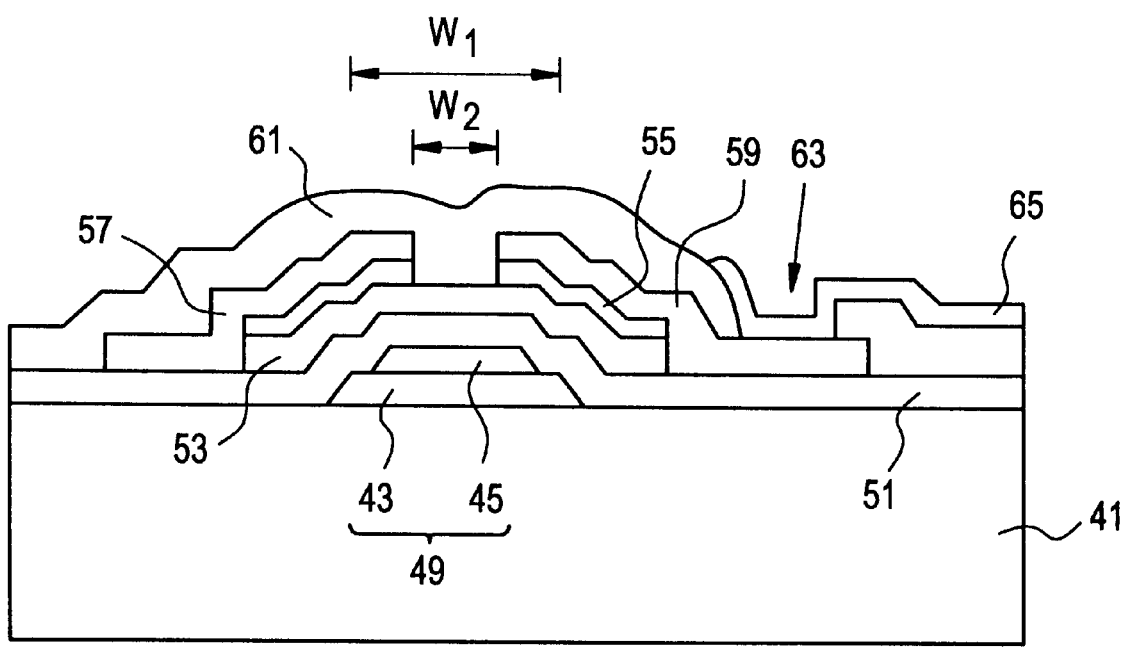

Referring to FIG. 4F, a second insulating layer 61 is formed by depositing insulating material such as silicon oxide or silicon nitride by CVD on the entire surface of the above structure. The second insulating layer is removed by photolithography to expose a designated portion of the drain electrode 59 and thus form a contact hole 63. Once transparent and conductive material such as ITO (Indium Tin Oxide) or Tin oxide $SnO_2$ is deposited on the second insulating layer 61 via sputtering and patterned by photolithography, a pixel electrode 65 is formed so that it is electrically connected to the drain electrode 59 through the contact hole 63.

In another preferred embodiment of the present invention, the first and second metal layers 43 and 45 are first etched by means of a dry etching having anisotropic etching characteristic such as RIE by using the photoresist 47 as a mask. The gate 49 is formed by etching the second metal layer 45 under the photoresist 47 with an etching solution prepared with a mixture of phosphoric acid $H_3PO_4$, acetic acid $CH_3COOH$ and nitric acid $HNO_3$.

In still another preferred embodiment of the present invention, the gate 49 is formed through a single etching step process for etching the first and second metal layers 43 and 45 simultaneously and via a single etching step, where the second metal layer 45 is etched more quickly than the first metal layer 43 with an etching solution prepared with a mixture of phosphoric acid $H_3PO_4$, acetic acid $CH_3COOH$ and nitric acid $HNO_3$. Because of the etching material and metals used for the first and second metal layers of the gate, only a single etching step is required. Despite the fact that a single etching step is used, it is still possible to obtain the relationship between the widths w1 and w2 of the first and second metal layers described above. In this process, the first and second metal layers forming the gate 49 are formed and patterned with a single photo resist step as described above and a single etching step.

As described above, in the preferred embodiments of the present invention, the first and second metal layers are sequentially deposited on the substrate without performing a masking step between the step of depositing the first metal layer and the second metal layer, followed by forming a photoresist that covers a designated portion of the second metal layer. In one preferred embodiment, the second metal layer is wet etched by using the photoresist as a mask but the first metal layer is dry etched. As a result, the double-metal gate is formed. In another preferred embodiment, a single etching step is used to form the double-metal gate wherein both the first metal layer and the second metal layer are wet etched, but the different in etching rates of the first and second metal layers produces different etching affects which result in the desired double-step structure.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A thin film transistor comprising:
   a substrate; and
   a gate including a double-layered structure having a first metal layer which is a bottom layer disposed on the substrate and a second metal layer disposed on the first metal layer, the first metal layer including aluminum, the second metal layer being arranged on the first metal layer to prevent hillock at the sides of the aluminum first metal layer, the first metal layer being wider than the second metal layer by about 1 to 4 $\mu$m.

2. The thin-film transistor as claimed in claim 1, wherein the second metal layer is located in a middle portion of the first metal layer so that two side portions of the first metal layer having no second metal layer disposed thereon have the same width as each other.

3. The thin-film transistor as claimed in claim 1, wherein the second metal layer includes at least one of Mo, Ta, and Co.

4. A thin film transistor comprising:
   a substrate;
   a gate including a double-layered structure having a first metal layer which is a bottom layer disposed on the substrate and a second metal layer disposed on the first metal layer, the first metal layer including aluminum, the second metal layer being arranged on the first metal layer to prevent hillock at the sides of the aluminum first metal layer, the first metal layer being wider than the second metal layer by about 1 to 4 $\mu$m;
   a first insulating layer disposed on the substrate including the gate;
   a semiconductor layer disposed on a portion of the first insulating layer at a location corresponding to the gate;
   an ohmic contact layer disposed on two sides of the semiconductor layer;
   a source electrode and a drain electrode disposed on the ohmic contact layer and extending onto the first insulating layer; and
   a second insulating layer covering the semiconductor layer, the source and drain electrodes and the first insulating layer.

5. The thin-film transistor as claimed in claim 4, wherein the second metal layer is located in a middle portion of the first metal layer so that two side portions of the first metal layer having no second layer thereon have the same width as each other.

6. The thin-film transistor as claimed in claim 4, wherein the second metal layer includes at least one of Mo, Ta, and Co.

* * * * *

(12) EX PARTE REEXAMINATION CERTIFICATE (9378th)
United States Patent
Ahn et al.

(10) Number: US 5,905,274 C1
(45) Certificate Issued: Oct. 26, 2012

(54) THIN-FILM TRANSISTOR AND METHOD OF MAKING SAME

(75) Inventors: Byung-Chul Ahn, Kumi-shi (KR); Hyun-Sik Seo, Anyang-shi (KR)

(73) Assignee: LG Display Co., Ltd., Seoul (KR)

Reexamination Request:
No. 90/009,481, Jun. 8, 2009

Reexamination Certificate for:
Patent No.: 5,905,274
Issued: May 18, 1999
Appl. No.: 08/918,119
Filed: Aug. 27, 1997

(30) Foreign Application Priority Data

Mar. 4, 1997 (KR) .................................. 97-7010

(51) Int. Cl.
*H01L 29/66* (2006.01)
*H01L 29/40* (2006.01)
*H01L 21/28* (2006.01)
*H01L 21/336* (2006.01)
*H01L 29/423* (2006.01)
*H01L 29/49* (2006.01)
*H01L 29/786* (2006.01)
*H01L 21/02* (2006.01)

(52) U.S. Cl. .............. 257/59; 257/61; 257/72; 257/350; 257/E29.137; 257/E29.283; 257/E29.151; 257/E21.414

(58) Field of Classification Search ........................ None
See application file for complete search history.

(56) References Cited

To view the complete listing of prior art documents cited during the proceeding for Reexamination Control Number 90/009,481, please refer to the USPTO's public Patent Application Information Retrieval (PAIR) system under the Display References tab.

*Primary Examiner* — Erik Kielin

(57) ABSTRACT

A thin-film transistor includes a substrate and a gate including a double-layered structure having first and second metal layers provided on the substrate, the first metal layer being wider than the second metal layer by about 1 to 4 μm. A method of making such a thin film transistor includes the steps of: depositing a first metal layer on a substrate, depositing a second metal layer directly on the first metal layer; forming a photoresist having a designated width on the second metal layer; patterning the second metal layer via isotropic etching using the photoresist as a mask; patterning the first metal layer by means of an anisotropic etching using the photoresist as a mask, the first metal layer being etched to have the designated width, thus forming a gate having a laminated structure of the first and second metal layers; and removing the photoresist.

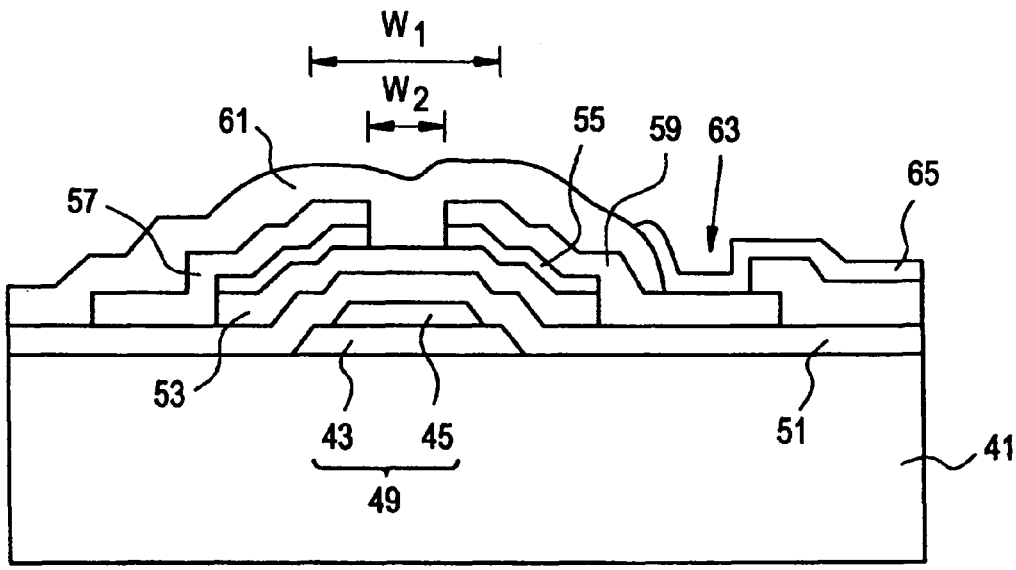

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1-6 are cancelled.

\* \* \* \* \*